United States Patent
Lee et al.

(10) Patent No.: US 9,634,253 B2
(45) Date of Patent: Apr. 25, 2017

(54) DONOR-ACCEPTOR CONJUGATED POLYMER AND ORGANIC ELECTRONIC DEVICE COMPRISING THE SAME

(71) Applicant: GWANGJU INSTITUTE OF SCIENCE AND TECHNOLOGY, Gwangju (KR)

(72) Inventors: Jae-Suk Lee, Gwangju (KR); Moon-Ho Ham, Gwangju (KR); Myungwoo Son, Gwangju (KR); Walaa Ahmed Ahmed Elsawy, Gwangju (KR); Myung-Jin Kim, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 14/741,140

(22) Filed: Jun. 16, 2015

(65) Prior Publication Data
US 2016/0017077 A1    Jan. 21, 2016

(30) Foreign Application Priority Data

Jul. 21, 2014    (KR) ........................ 10-2014-0092054

(51) Int. Cl.
| | |
|---|---|
| C08G 75/06 | (2006.01) |
| H01L 45/00 | (2006.01) |
| H01L 51/00 | (2006.01) |
| C08G 61/12 | (2006.01) |
| C08L 65/00 | (2006.01) |
| C08F 226/06 | (2006.01) |
| G11C 13/00 | (2006.01) |
| H01L 51/42 | (2006.01) |

(52) U.S. Cl.
CPC ........ *H01L 51/0043* (2013.01); *C08G 61/124* (2013.01); *C08G 61/126* (2013.01); *C08L 65/00* (2013.01); *H01L 45/14* (2013.01); *H01L 51/0036* (2013.01); *C08G 2261/124* (2013.01); *C08G 2261/1412* (2013.01); *C08G 2261/1424* (2013.01); *C08G 2261/18* (2013.01); *C08G 2261/3223* (2013.01); *C08G 2261/344* (2013.01); *C08G 2261/40* (2013.01); *G11C 13/0014* (2013.01); *G11C 13/0016* (2013.01); *H01L 51/42* (2013.01)

(58) Field of Classification Search
CPC ........................................ C08G 75/06
USPC ........................................ 528/377; 526/256
See application file for complete search history.

(56) References Cited

PUBLICATIONS

Elsawy et al; Isoindigo-based small—device performance; Aug. 2013; Royal Society of Chemistry; Chem Abstract 159: 442682.*
[Supportive Materials for Exception to Loss of Novelty] Published at 2014 Spring Conference of the of the Korean Institute of Metals and Materials on Apr. 24, 2014.

* cited by examiner

*Primary Examiner* — Duc Truong
(74) *Attorney, Agent, or Firm* — Hauptman Ham, LLP (57) ABSTRACT

Disclosed herein are a donor-acceptor conjugated polymer and an organic electronic device including the same. According to embodiments of the invention, it is possible to realize a conjugated polymer suitable for organic memory devices and a multi-functional, high-performance, large-area organic memory device for electronics including the same, the organic memory device operating in air.

8 Claims, 8 Drawing Sheets

DONOR-ACCEPTOR CONJUGATED POLYMER AND ORGANIC ELECTRONIC DEVICE COMPRISING THE SAME

BACKGROUND

1. Technical Field

The present invention relates to a donor-acceptor conjugated polymer and an organic electronic device including the same.

2. Description of the Related Art

Organic electronic devices such as organic thin film transistors, light emitting diodes, solar cells, and memories have attracted great attention in relation to future application to flexible devices by virtue of ease of manufacture/processing, low cost, flexibility, extensibility, printability, and the like. In particular, an organic memory has been studied on application to data storage media for flexible devices. Various polymers, such as polythiophene, polyaniline, polyvinylcarbazole, and polyimide have been generally used as a polymer electrolyte or a matrix in a doping system or a mixing system. As part of an effort to improve memory effects, several research groups introduced organic nanoparticles or carbon nanomaterials (carbon nanotubes, graphene, or fullerene) into a polymer matrix to enhance switching properties (write-once-read-many properties, unipolar or bipolar switching) and memory performance. However, it is difficult to achieve uniform dispersion of nanoscale particles in a polymer due to agglomeration of ions which can cause deterioration in memory performance.

Recently, it has been confirmed that a donor-acceptor-based polymer system having an aliphatic hydrocarbon backbone, such as a block copolymer of poly(9-(4-vinylphenyl)carbazole) (electron donor) and poly(2-vinylpyridine) (electron acceptor) or a fullerene (electron acceptor) end-capped poly(2-(N-carbazolyl)-ethyl methacrylate) (electron donor), exhibits excellent non-volatile memory performance. In addition, there was a study on applicability of a polymer, which has both donor and acceptor parts within a repeat unit and exhibits excellent dimensional stability, to non-volatile memory devices. A donor-acceptor (D-A) conjugated polymer allows electron transition between a ground state and an excited state, required for an active layer of memory devices, and effectively prevents agglomeration of ions to allow formation of a uniform thin film, thereby considerably improving performance of the device. In such a D-A conjugated polymer system, it is possible to control electric charge transfer between the donor part and the acceptor part through strength and arrangement of donor and acceptor materials, which plays an important role in enhancement of electrically bi-stable switching behavior. Chen, et al., succeeded in preparation of a D-A conjugated polymer composed of selenophene and 3,6-dithiophene-2-yl-2,5-dialkylpyrrolo[3,4-c]pyrrole-1,4-dione, which exhibits transistor type non-volatile memory properties due to the film morphology and the ambipolar nature of polymers. A resistive memory is a 2-terminal device having a simple sandwich structure of metal/insulator/metal (MIM), whereas a transistor type memory is a 3-terminal device. Elimination of a need for transistors has an advantage in terms of reduction in manufacturing costs. In addition, few polymers exhibit both memory effects and environmental stability. For actual application, these problems must be overcome.

BRIEF SUMMARY

The present invention is aimed at providing a conjugated polymer that is stable in air, an organic electronic device including the same, and a method of preparing the same.

In accordance with one aspect of the present invention, there is provided a conjugated polymer having a structure represented by Formula 1:

In accordance with another aspect of the present invention, there is provided an active layer for memories or a photoactive layer for organic photoelectric devices including the conjugated polymer according to embodiments of the present invention.

In accordance with a further aspect of the present invention, there is provided an organic electronic device including the conjugated polymer according to embodiments of the present invention.

In accordance with a yet further aspect of the present invention, there is provided a method of preparing the conjugated polymer represented by Formula 1, including CH arylation polymerization of a compound represented by Formula 2 and a compound represented by Formula 3.

According to embodiments of the present invention, it is possible to realize a conjugated polymer for organic memory devices and a multi-functional, high-performance, large-area organic memory device for electronics including the same, the organic memory device operating in air.

DETAILED DESCRIPTION

Hereinafter, various aspects and embodiments of the present invention will be described in detail.

One aspect of the present invention relates to a conjugated polymer having a structure represented by Formula 1:

wherein p and q are the same or different and are each independently an integer from 1 to 30; $R_1$, $R_2$, $R_3$ and $R_4$ are the same or different and each independently selected from a $C_1$ to $C_{30}$ alkyl group, an acyl group, an alkoxycarbonyl group, and a trifunctional amine; and n is an integer from 10 to 10,000.

According to one embodiment, p and q may be 1; $R_1$ and $R_2$ may be a $C_{10}$ alkyl group and a $C_8$ alkyl group, respectively; and $R_3$ and $R_4$ may be a C10 alkyl group and a C8 alkyl group, respectively.

According to another embodiment, $R_1$ and $R_2$ may be —$C_{10}H_{21}$ and —$C_8H_{17}$, respectively, and $R_3$ and $R_4$ may be —$C_{10}H_{21}$ and —$C_8H_{17}$, respectively.

Another aspect of the present invention relates to an active layer for memories or a photoactive layer for organic photoelectric devices including the conjugated polymer according to embodiments of the present invention.

A further aspect of the present invention relates to an organic electronic device including the conjugated polymer according to embodiments of the present invention.

Examples of the organic electronic device according to the invention include organic thin film transistors, light emitting diodes, solar cells, and memories, without being limited thereto.

However, considering that the conjugated polymer according to the invention is stable in air, it is desirable that the conjugated polymer be particularly used in non-volatile memory devices or MIM type memory devices.

Yet another aspect of the present invention relates to a method of preparing the conjugated polymer represented by Formula 1, including CH arylation polymerization of a compound represented by Formula 2 and a compound represented by Formula 3.

[Formula 2]

[Formula 3]

wherein p, q, $R_1$, $R_2$, $R_3$, $R_4$ and n are the same as defined above, and X is a halogen group.

According to one embodiment, CH arylation polymerization may be performed in the presence of palladium acetate, potassium acetate, and tetrabutylammonium bromide.

Next, the present invention will be described in more detail with reference to examples. However, it should be noted that these examples are provided for illustration only and should not be construed in any way as limiting the invention. It is apparent that the present invention will be easily practiced by those skilled in the art in light of the present disclosure including the following embodiments even without specific experimental results.

EXAMPLES

Materials (2,3-dihydrothieno[3,4-b][1,4]dioxin-5-yl) was purchased from Sigma-Aldrich Corporation. 6,6'-dibromoisoindigo and 1-iodo-2-octyldodecane were prepared by a typical method known in the art. Other chemicals and solvents were used as purchased without further treatment.

Preparation of (E)-6,6'-dibromo-1,1-bis(2-octyldodecyl)-(3,3'-biindolinylidene)-2,2'-dione (1)

Under a nitrogen atmosphere, 1-iodo-2-octyldodecane was introduced through a partition into a suspension of 6,6'-dibromoisoindigo (400 mg, 0.950 mmol) in dimethylformaldehyde (DMF) (40 mL) and potassium carbonate (731 mg, 2.86 mmol). The obtained mixture was subjected to stirring at 100° C. for 24 hours, and then put into water (200 mL). The organic phase was extracted with $CH_2Cl_2$ and washed with salt water, followed by drying over $MgSO_4$. After removal of the solvent under reduced pressure, the obtained red solid was purified by silica chromatography ($CH_2Cl_2$:hexane=1:2) (yield=75%). $^1$H-NMR ($CDCl_3$) δ (ppm): 9.04 (d, J=9 Hz, 2H), 7.14 (dd, J1=9 Hz, J2=1.8 Hz, 2H), 6.88 (d, J=1.8 Hz, 2H), 3.56 (d, J=7.5 Hz, 4H), 1.85 (bs, 2H), 1.40-1.24 (m, 58H), 0.88-0.84 (m, 12H); $^{13}$C-NMR ($CDCl_3$) δ: 168.08, 145.98, 132.58, 130.5, 126.42, 124.87, 119.7, 111.47, 44.69, 36.03, 31.9, 31.8, 31.46, 29.9, 29.8, 29.6, 29.5, 29.3, 29.2, 22.68, 22.65, 26.34, 14.11, 14.10.

Preparation of (E)-1,1'-bis(2-octyldecyl)-6,6'-bis(4,4,5,5-tetramethyl-1,3,2-dioxaborolane-2-yl)-[3,3'-biindolinylidene]-2,2'-dione (2)

(E)-6,6'-dibromo-1,1-bis(2-octyldecyl)-(3,3'-biindolinylidene)-2,2'-dione (1) (500 mg, 0.54 mmol), pinacol ester of diboron (1.10 g, 1.08 mmol), [PdCl2(dppf)] (21 mg), and potassium acetate (317 mg, 3.24 mmol) were mixed at room temperature under an argon atmosphere. Anhydrous 1,4-dioxane (20 mL) was introduced through a partition using an injector. The obtained mixture was held at 80° C. for 30 hours, and then cooled to room temperature. The resulting mixture was filtered through silica gel, followed by washing with a mixture of methylene chloride and hexane (1:1). The collected fractions were concentrated and then precipitated in cold methanol (100 mL). The precipitate was filtered, followed by drying, thereby obtaining a product in a yield of 80%. $^1$H-NMR ($CDCl_3$) δ (ppm): 9.14 (d, J=8.01 Hz, 2H), 7.48 (d, J=7.79 Hz, 2H), 7.15 (s, 2H), 3.67 (d, J=7.56 Hz, 2H), 1.95 (s, 2H), 1.56-1.20 (m, 76H), 0.850 (t, J=6.6 Hz, 12H); $^{13}$C-NMR ($CDCl_3$) δ: 168.0, 144.4, 134.5, 129.0, 128.9, 124.4, 113.7, 84.2, 44.6, 36.3, 32.1, 32.0, 31.8, 31.2, 29.8, 29.78, 29.5, 26.6, 25.1, 22.9, 22.8, 14.32, 14.30.

Preparation of PIDED

Into a dried 2-neck flask filled with nitrogen, (E)-6,6'-dibromo-1,1-bis(2-octyldecyl)-(3,3'-biindolinylidene)-2,2'-dione (1) (100 mg, 0.102 mmol), 2,3-dihydrothieno[3,4-b][1,4]dioxin (30 mg, 0.102 mmol), palladium acetate (5 mg, 0.020 mmol), potassium acetate (51 mg, 0.611 mmol), and tetrabutylammonium bromide (61 mg, 0.204 mmol) were placed. After emptying the flask, the flask was again filled with argon. Then, DMF (15 mL) with bubbles removed therefrom was introduced through a partition. Bubbles were removed from the obtained solution for 20 minutes under a nitrogen atmosphere, followed by holding at 120° C. for 24 hours. The obtained mixture was cooled to room temperature and then slowly poured into methanol (100 mL). The produced precipitate was collected via filtration. The crude product was purified via Soxhlet extraction using methanol and acetone, thereby removing low molecular materials and catalyst residues. Finally, high molecular fractions were extracted with chloroform, followed by adding diethylammonium diethyldithiocarbamate (for removal of palladium, ~20 mg) thereto all at once. The resulting mixture was subjected to stirring at room temperature for 2 hours and then slowly poured into methanol (100 mL). The produced precipitate was filtered and dissolved in a small amount of chloroform, and then precipitated again in methanol (50 mL). The produced precipitate was collected via filtration and dried (yield=80%). $^1$H-NMR($CDCl_3$) δ (ppm): 9.16-8.76 (m, 2H), 7.38-6.63 (m, 4H), 4.87-4.00 (m, 4H), 3.79-3.46 (m, 4H), 1.98-0.640 (m, 72H). GPC: Mn=43.00 kDa, PDI=1.60.

Preparation of PID

In a dried 2-neck flask filled with nitrogen, (E)-6,6'-dibromo-1,1-bis(2-octyldecyl)-(3,3'-biindolinylidene)-2,2'-dione (1) (100 mg, 0.102 mmol), (E)-1,1'-bis(2-octyldecyl)-6,6'-bis(4,4,5,5-tetramethyl-1,3,2-dioxaborolane-2-yl)-[3,3'-biindolinylidene]-2,2'-dione (2) (103 mg, 0.102 mmol), and Pd(Ph$_3$)$_4$ (23.5 mg) were mixed under an argon atmosphere, followed by introduction of toluene (10 mL). Bubbles were removed from the resulting mixture for 15 minutes, followed by adding potassium carbonate and holding the resulting mixture at 85° C. for 24 hours. The obtained mixture was cooled to room temperature and then slowly poured into methanol (100 mL). The produced precipitate was collected via filtration. The crude product was purified via Soxhlet extraction using methanol and acetone, thereby removing low molecular weight materials and catalyst residues. Finally, high molecular weight fractions were extracted with chloroform, followed by adding diethylammonium diethyldithiocarbamate (for removal of palladium, ~20 mg) thereto all at once. The resulting mixture was subjected to stirring at room temperature for 2 hours and then slowly poured into methanol (100 mL). The produced precipitate was filtered and dissolved in a small amount of chloroform, and then precipitated again in methanol (50 mL). The produced precipitate was collected via filtration and dried (yield=80%). $^1$H-NMR (CDCl$_3$) δ (ppm): 8.91-8.69 (m, 2H), 7.40-6.74 (m, 4H), 3.70-3.48 (m, 4H), 2.00-0.600 (m, 72H). GPC: Mn=25 kDa, PDI=1.50.

Manufacture of Device and Property Evaluation

An 8×8 crossbar array type organic memory device having a structure of metal/insulator/metal was fabricated on a Si/SiO$_2$ substrate. First, a Si/SiO$_2$ substrate was completely cleaned in a continuous manner by ultrasonication processes using acetone, methanol, and deionized water for 3 minutes each, and then dried over nitrogen gas. Al (80 nm) was deposited on the substrate by e-beam evaporation using a metal shadow mask to pattern 8 lines with a linewidth of 100 μm, thereby forming a bottom electrode. A surface of the Al electrode was exposed to UV light for 10 minutes to increase adhesion between Al and a polymeric active layer. Then, a D-A conjugated polymer (PIDED) solution was spin coated onto the substrate with Al deposited thereon at 2000 rpm for 40 seconds. The obtained polymer film was subjected to soft baking using a hot plate at 60° C. for 10 minutes, followed by hard baking in a vacuum oven at 100° C. for 24 hours to remove solvent residues and enhance uniformity of the film. Finally, Al (80 nm), as a top electrode, was deposited in a direction crossing the bottom electrode by e-beam evaporation using a metal shadow mask. For comparison, besides PIDED, each of a D-A blended polymer (PEDOT/PID) and an acceptor homopolymer (PID) was interposed as active materials between two Al electrodes, thereby fabricating a device. The fabricated devices were measured as to electrical properties using an Agilent E5270B semiconductor parameter analyzer (SPA) under an air, vacuum, or nitrogen atmosphere.

Experimental Results

As such, in the above examples, it was confirmed that an MIM type memory device including a low bandgap D-A conjugated polymer as an active layer, that is, poly((E)-6,6'-bis(2,3-dihydrothieno[3,4-b][1,4]dioxin-5-yl)-1,1'-bis-(2-octyldecyl)-[3,3'-biindolinylidene]-2,2'-dipne) (PIDED) prepared through CH arylation polymerization of 2,3-dihydrothieno[3,4-b][1,4]dioxin (EDOT) provided as an electron donor, and isoindigo provided as an electron acceptor, exhibited a non-volatile resistive switching behavior stable in air.

A memory device was fabricated and evaluated under an air atmosphere in accordance with one embodiment of the invention. Compared with measurement results under a nitrogen atmosphere and a vacuum atmosphere, the fabricated device exhibited very stable memory performance such as a high on/off current ratio (~10$^4$), excellent endurance cycle properties (>200 cycles), and a long retention time (>10$^4$ seconds) in air. Such an organic memory device stable in air using the D-A conjugated polymer is useful for implementing a low-cost high-performance organic electronic circuit.

Figure 1:
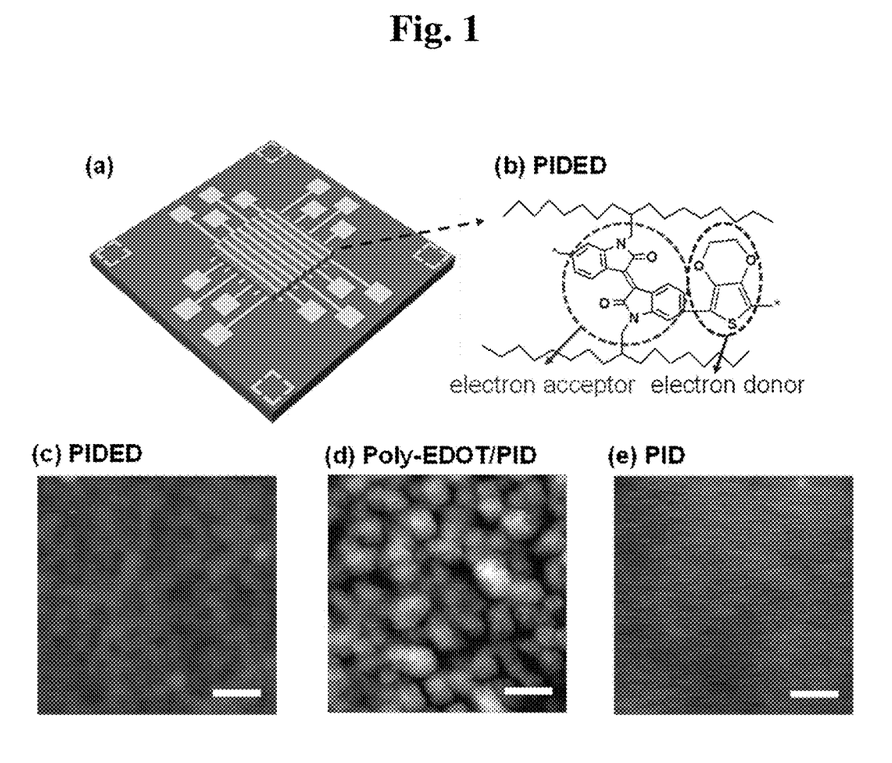
In FIG. 1, (a) is a schematic view of an 8×8 crossbar array type organic memory device with a structure of Al/polymer/Al, wherein, PIDED, a PEDOT/PID blend, and a PID homopolymer were used as an active layer; (b) shows a conjugated polymer PIDED having PEDOT and PID as a donor part and an acceptor part, respectively; and (c) to (e) show AFM images (scale bar: 300 nm) of a conjugated polymer (PIDED), a blended polymer (PEDOT/PID), and an acceptor homopolymer (PID), respectively, wherein RMS roughness values of PIDED, PEDOT/PID, and PID are 0.35 nm, 2.3 nm, and 0.27 nm, respectively.

In FIG. 1, (a) is a schematic view of an 8×8 crossbar array type organic memory device having a structure wherein a polymer layer is sandwiched between two Al electrodes. For uniform dispersion in a polymer film and improvement in memory performance, a conjugated polymer PIDED composed of strong acceptor and donor parts was prepared by CH arylation polymerization (b). Isoindigo was initially prepared by condensation of bromoisatin with bromooxindole, followed by alkylation, thereby obtaining (E)-6,6'-dibromo-1,1'-bis(2-octyldecyl)-(3,3'-biindolinylidene)-2,2'-dione (1). Synthetic paths of (a) PIDED and (b) PID are shown in the following Reaction Formulas, respectively.

[Reaction Formula 1]

-continued

PID

As shown in Reaction Formulas, PIDED was prepared by CH arylation polymerization of the compound (1) with 2,3-dihydrothieno[3,4-b][1,4]dioxin (EDOT) in the presence of palladium acetate, potassium acetate, and tetrabutylammonium bromide.

Polyisoindigo (PID) was prepared by Suzuki cross-coupling of the compound (1) with (E)-1,1'-bis(2-octyldecyl)-6,6'-bis(4,4,5,5-tetramethyl-1,3,2-dioxaborolane-2-yl)-[3,3'-biindolinylidene]-2,2'-dione (2) (Reaction Formula S1) using $Pd(Ph_3)_4$. Crystalline residues were removed by Soxhlet extraction processes using methanol, hexane, and acetone, each taking 24 hours, thereby purifying the obtained polymer. The resulting polymer exhibited high solubility in typical organic solvents.

Three polymers, i.e. a D-A conjugated polymer (PIDED), a D-A blended polymer (poly(2,3-dihydrothieno[3,4-b][1,4]dioxin-5-yl) (PEDOT)/PID), and a polymer composed of an acceptor alone (PID). It was confirmed using an atomic force microscope (AFM) that PIDED exhibited uniform dispersion without phase separation, unlike the blend of PEDOT and PID (FIGS. 1c and 1d). PIDED had a root mean square (RMS) roughness of 0.35 nm, which is close to that of the PID homopolymer (0.27 nm) and lower than that of the PEDOT/PID blend (2.3 nm) ((c) to (e) in FIG. 1). An organic memory device was fabricated using each of these polymers under an air atmosphere.

Figure 2:
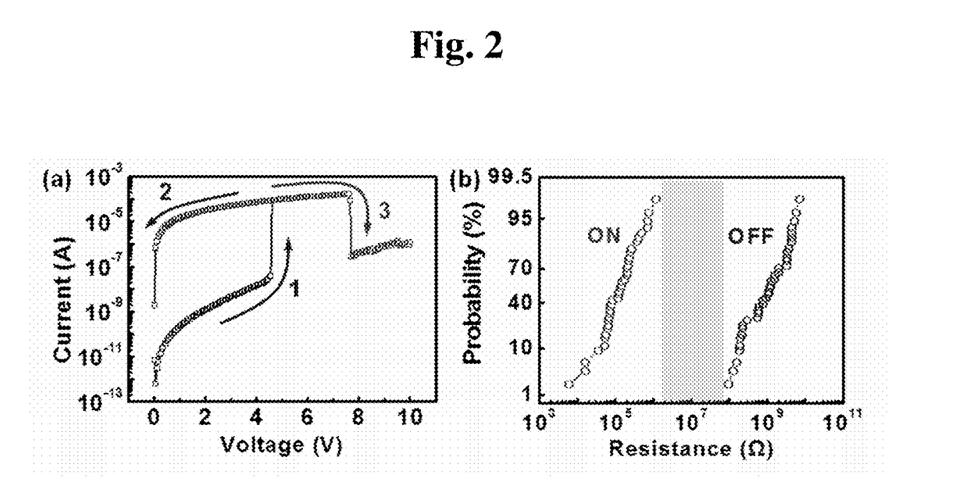
In FIG. 2, (a) shows an I-V curve of an Al/PIDED/Al memory device, and (b) shows cumulative probability properties of switching current of memory cells as measured at a read voltage of 0.3 V.

A current-voltage (I-V) curve of the device fabricated using the D-A conjugated polymer PIDED was measured under an air atmosphere. Results are shown in (a) in FIG. 2 with a bottom electrode (Al) grounded, a voltage was applied to a top electrode (Al). The voltage was restricted up to 10 V so as to prevent electrical breakdown of the device. Each cell of the device exhibited typical unipolar resistive switching properties under the same bias polarity. When the applied voltage was swept from 0 to 5 V, the devices were switched from the initial high-resistance state (HRS, OFF state) to the low-resistance state (LRS, ON state) at a threshold voltage of approximately 4.5 V. Such a process corresponds to a setting or writing process of a memory device. The device remained in the ON state during decreasing voltage, and even after removal of the applied voltage, and thus exhibited a non-volatile memory behavior. Next, the voltage was swept from 0 V to 10 V. The electrical current abruptly decreased when the applied voltage reached about 7.5 V, which means a change in electrical state from LRS to HRS (reset or erasing process). Based on these I-V properties, operating voltages for writing, erasing and reading processes were determined to be about 5 V, about 10 V, and about 0.3 V, respectively. (b) in FIG. 2 shows a cumulative probability plot of switching current for all memory cells. The on and off currents were clearly visualized by plotting the currents measured at a read voltage of 0.3 V. Although the distributions of the on- and off-current values are broad, it is important to note that the on and off currents are separated by more than one order of magnitude.

Figure 3:
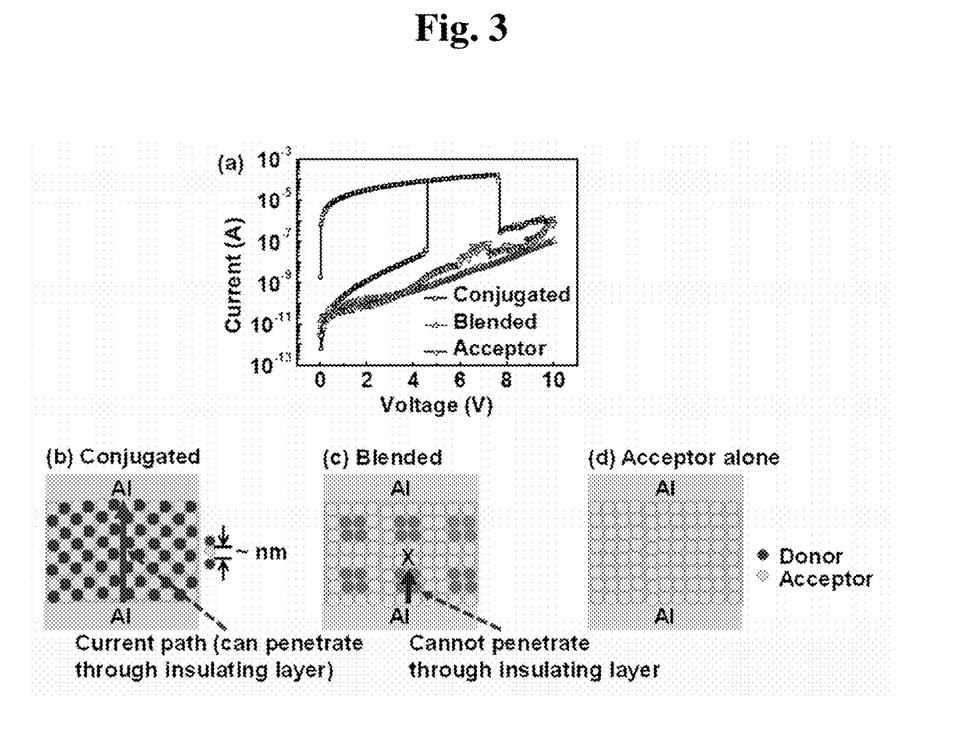
In FIG. 3, (a) shows I-V curves of MIM type memory devices fabricated using three active polymers (D-A conjugated polymer (PIDED), D-A blended polymer (PEDOT/PID), and acceptor homopolymer (PID)) and schematically shows electrical current flows within three polymer systems; and (b) to (d) show a D-A conjugated polymer (PIDED), a D-A blended polymer (PEDOT/PID), and an acceptor homopolymer (PID), respectively.
Figure 5:
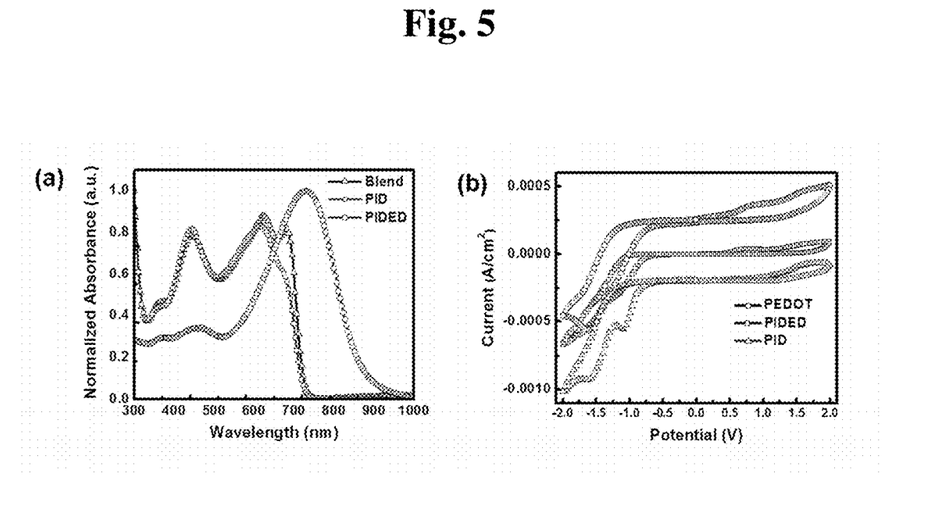
In FIG. 5, (a) shows UV-Vis-NIR absorption spectra of three polymers (D-A conjugated polymer (PIDED), donor homopolymer (PEDOT), and acceptor homopolymer (PID)); (b) shows cyclic voltammetry curves of three polymers (D-A conjugated polymer (PIDED), donor homopolymer (PEDOT), and acceptor homopolymer (PID)); and (c) shows energy band diagrams of three polymers (D-A conjugated polymer (PIDED), donor homopolymer (PEDOT), and acceptor homopolymer (PID)).

In order to investigate effects of uniform dispersion of donor and acceptor groups in a polymer film on memory performance, MIM type devices were fabricated using the D-A blended polymer (PEDOT/PID) and the acceptor homopolymer (PID), respectively, besides PIDED. FIG. 3a shows current-voltage properties of the devices fabricated using three polymers (PIDED, PEDOT/PID blend, and PID alone). Unlike in the case of PIDED, the devices fabricated using PEDOT/PID and PID remained in a low-current state without resistance switching, which means that there was no charge transfer between molecules. In the conjugated polymer system, a low bandgap was induced due to strong donor and acceptor parts alternately arranged, which was confirmed via UV-Vis-NIR light absorption measurement and cyclic voltammetry ((c) in FIG. 1 and S1), causing the polymer to have conductive or semiconductor properties. Thus, electrical charges can be effectively transferred along polymer backbones, and conduction pathways are formed in a polymer layer by applying an external bias, whereby the device exhibits a switching behavior ((b) in FIG. 3 and S1a). In addition, strong dipole moments sustain charge transfer, whereby a non-volatile behavior appears. In contrast, in the blend polymer system, fine phase separation of spherical structures occurs on a nanometer scale due to difference in solubility between each component in a solvent ((d) in FIG. 1 and (c) in FIG. 3). A donor polymer having low solubility agglomerates within an acceptor polymer matrix having high solubility. Such finely phase-separated structures disrupt effective charge transfer between a donor and an acceptor, thereby causing a high resistance state and absence of resistance switching. Results of UV-Vis-NIR light absorption measurement showed that the blended polymer exhibited strong absorption at 300 nm to 600 nm, similar to results for the acceptor homopolymer allowing no charge transfer ((a) in FIG. 5).

Figure 4:
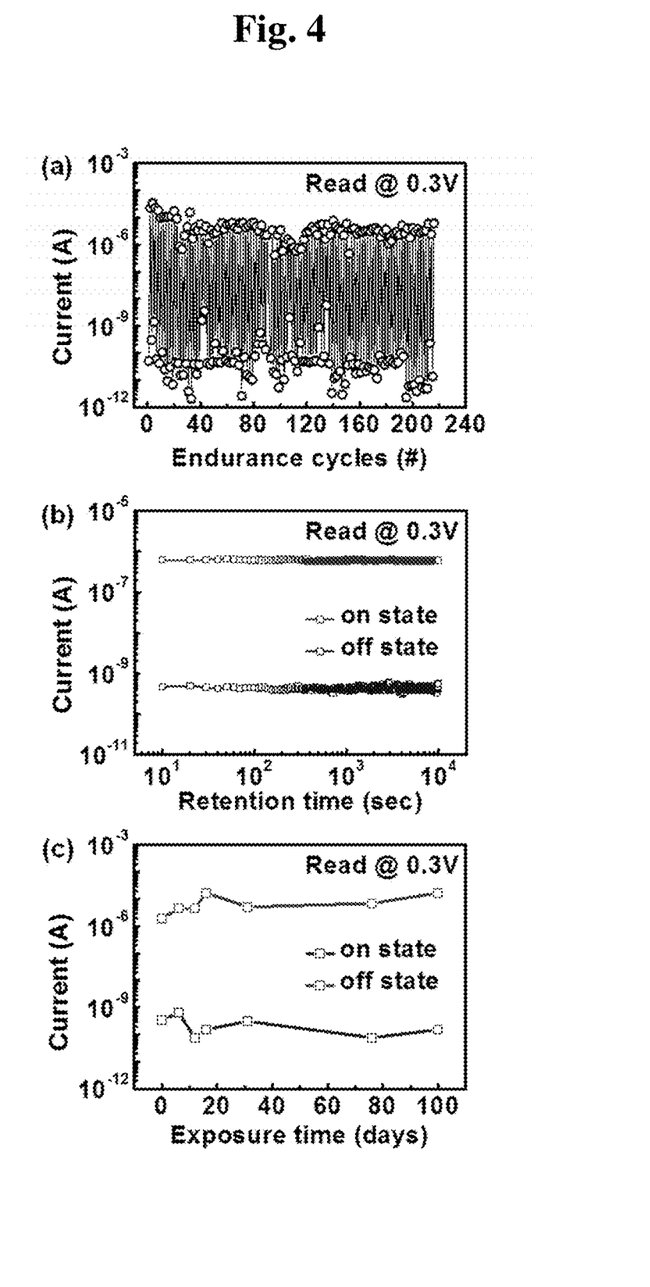
In FIG. 4, (a) and (b) show endurance cycle data and retention time of the Al/PIDED/Al memory device, respectively, wherein two current states (HRS and LRS) were read at 0.3 V after alternately applying a write voltage of 5 V and an erasing voltage of 8 V to a top electrode; and (c) shows changes in ON/OFF current according to exposure period, obtained from an I-V curve after the Al/PIDED/Al memory device was exposed to the air for a period of 3 months or more, from which it can be seen that memory performance is insignificantly affected by the air.

The memory device fabricated using PIDED was evaluated as to reliability via measurement of endurance and retention time in air. (a) in FIG. 4 shows an endurance cycle curve at a reading voltage 0.3 V obtained by repeatedly sweeping a single cell. The memory device was stable in both the ON state and OFF state until exceeding 200 cycles. An ON/OFF ratio was as high as about $10^4$, and there was no significant electrical deterioration. Thus, presence of reproducible resistance switching characteristics was con- firmed. In order to evaluate data retention abilities of the memory device, retention properties in ON/OFF states was investigated at a read voltage of 0.3 V ((b) in FIG. 4). The memory device exhibited stable retention properties for a duration of $10^4$ seconds or more.

Figure 6:
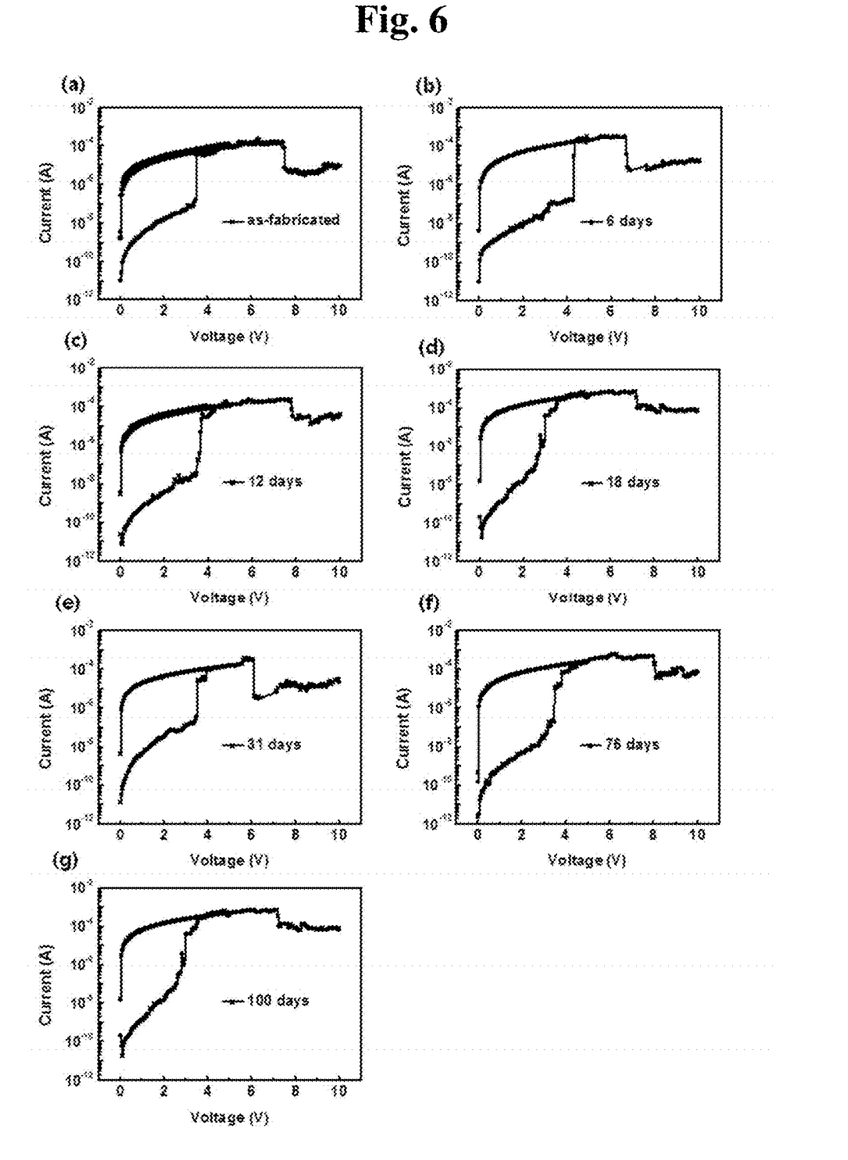
FIG. 6 shows an I-V curve obtained after the Al/PIDED/Al memory device was exposed to the air for 100 days. (a) as-fabricated; (b) 6 days; (c) 12 days; (d) 18 days; (e) 31 days; (f) 76 days; (g) 100 days.
Figure 7:
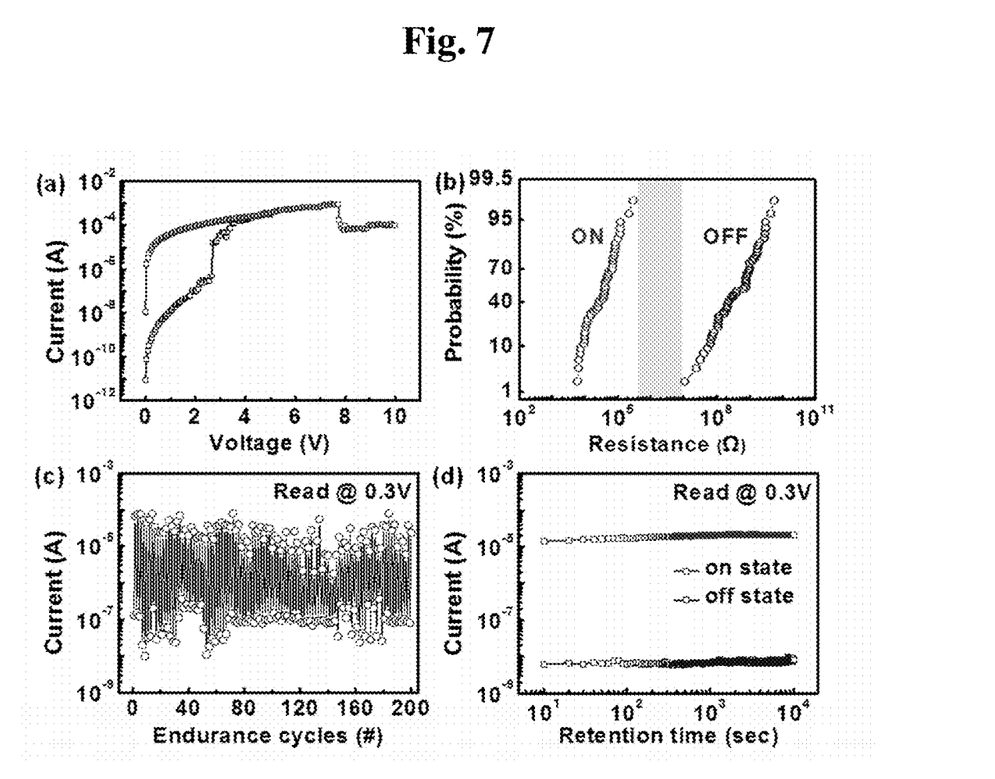
In FIG. 7, (a) shows an I-V curve of the Al/PIDED/Al memory device; (b) shows cumulative probability properties of switching current of memory cells as measured at a read voltage of 0.3 V; and (c) and (d) show endurance cycle data and retention time of the Al/PIDED/Al memory device, as measured at a read voltage of 0.3 V, respectively, wherein all the measurement were performed under a vacuum.
Figure 8:
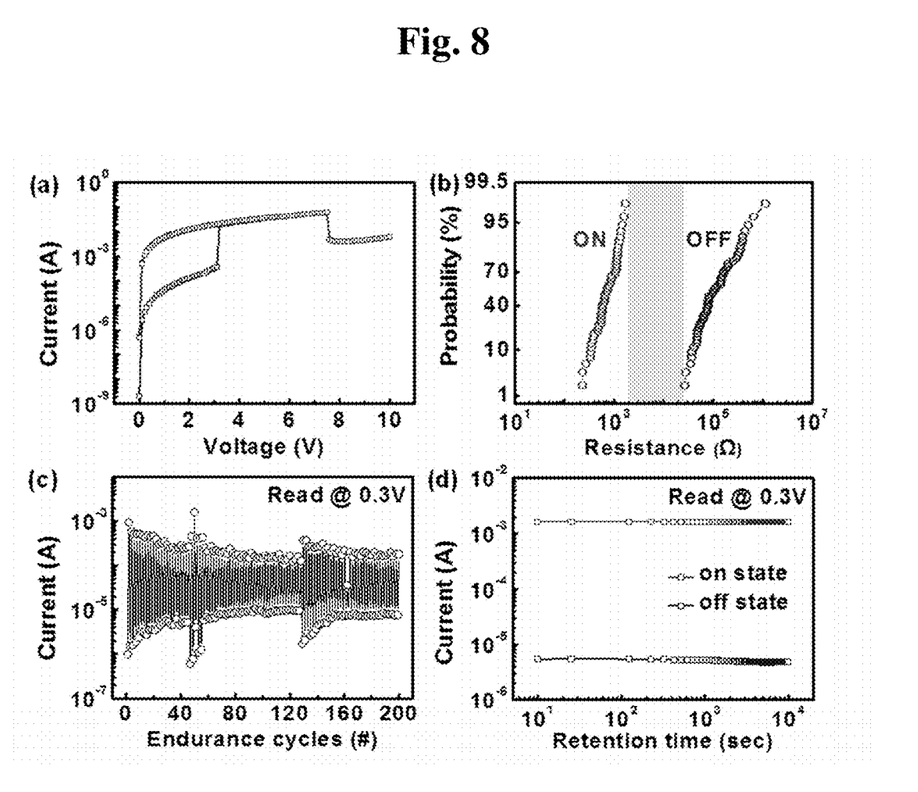
In FIG. 8, (a) shows an I-V curve of the Al/PIDED/Al memory device, (b) shows cumulative probability properties of switching current of memory cells as measured at a read voltage of 0.3 V; and (c) and (d) show endurance cycle data and retention time of the Al/PIDED/Al memory device, as measured at a read voltage of 0.3 V, respectively, wherein all measurements were performed under a nitrogen atmosphere.

Finally, in order to identify environmental stability, which is a precondition for actual application of the device, the memory device was exposed to the air, followed by measuring an I-V curve of the device (FIG. 6). An ON current and an OFF current obtained from the I-V curve were not considerably affected by the air ((c) in FIG. 4). For comparison, stability of the device was measured in a vacuum atmosphere and a nitrogen atmosphere (FIGS. 7 and 8). Memory performance of the device was similar to that measured in air. From this result, it can be seen that memory performance of the PIDED-based memory device is insignificantly affected by environmental conditions.

In the present invention, an MIM type memory device stable in air is fabricated using PIDED having strong donor and acceptor parts prepared through CH arylation polymerization. It should be noted that this PIDED-based memory device is fabricated and operated under an air atmosphere. The fabricated device exhibited a non-volatile unipolar resistive switching behavior, a high ON/OFF current ratio, excellent endurance cycle properties, and a long retention time, similar to measurement results under vacuum and nitrogen atmospheres. Based on comparison of the conjugated polymer PIDED with the blend polymer PEDOT/PID in terms of film morphology, it was confirmed that excellent charge transfer between molecules and excellent memory performance was attributed to donor and acceptor groups uniformly dispersed in a polymer film. With the design of a conjugated polymer wherein donor and acceptor parts are alternately arranged in a regular manner, a multi-functional high-performance large area organic memory device operating in air can be put to practical use.

What is claimed is:

1. A conjugated polymer having a structure represented by Formula 1:

wherein p and q are the same or different and are each independently an integer from 1 to 30; $R_1$ and $R_2$ are $-C_{10}H_{21}$ and $-C_8H_{17}$, respectively; and $R_3$ and $R_4$ are $-C_{10}H_{21}$ and $-C_8H_{17}$, respectively; and n is an integer from 10 to 10,000.

2. The conjugated polymer according to claim 1, wherein p and q are 1.

3. An active layer for memories comprising the conjugated polymer according to claim 1.

4. A photoactive layer for organic photoelectric devices comprising the conjugated polymer according to claim 1.

5. An organic electronic device comprising the conjugated polymer according to claim 1.

6. The organic electronic device according to claim 5, wherein the organic electronic device is one selected from among an organic thin film transistor, a light emitting diode, a solar cell, and a memory.

7. The organic electronic device according to claim 6, wherein the memory is a non-volatile memory device.

8. The organic electronic device according to claim 5, wherein the organic electronic device is an MIM type memory device.

* * * * *